United States Patent
Tran et al.

(10) Patent No.: US 7,998,865 B2
(45) Date of Patent: *Aug. 16, 2011

(54) SYSTEMS AND METHODS FOR REMOVING WAFER EDGE RESIDUE AND DEBRIS USING A RESIDUE REMOVER MECHANISM

(75) Inventors: Joe G. Tran, Flower Mound, TX (US); Brian K. Kirkpatrick, Allen, TX (US); Alfred J. Griffin, Jr., Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1387 days.

This patent is subject to a terminal disclaimer.

(21) Appl. No.: 11/141,534

(22) Filed: May 31, 2005

(65) Prior Publication Data
US 2006/0270231 A1    Nov. 30, 2006

(51) Int. Cl.
*H01L 21/302* (2006.01)
(52) U.S. Cl. .......................... 438/690; 15/77; 451/43
(58) Field of Classification Search .............. 451/212, 451/285, 43, 239, 44; 257/E21.237; 15/77; 438/690
See application file for complete search history.

(56) References Cited

U.S. PATENT DOCUMENTS

| | | | |
|---|---|---|---|
| 5,110,764 A * | 5/1992 | Ogino | 451/63 |
| 5,868,866 A * | 2/1999 | Maekawa et al. | 134/34 |
| 5,944,584 A * | 8/1999 | Toyama | 451/41 |
| 5,976,267 A | 11/1999 | Culkins et al. | |
| 6,299,698 B1 | 10/2001 | Emami et al. | |
| 6,797,074 B2 | 9/2004 | Redeker et al. | |
| 6,813,796 B2 | 11/2004 | Roy et al. | |
| 6,855,030 B2 | 2/2005 | Halley | |
| 6,869,337 B2 | 3/2005 | Boyd et al. | |
| 6,869,894 B2 | 3/2005 | Moore | |
| 6,924,236 B2 * | 8/2005 | Yano et al. | 438/692 |
| 6,979,649 B2 * | 12/2005 | Arai et al. | 438/691 |
| 2004/0171502 A1 * | 9/2004 | Clark et al. | 510/175 |

* cited by examiner

*Primary Examiner* — Shay Karls
(74) *Attorney, Agent, or Firm* — Warren L. Franz; Wade J. Brady, III; Frederick J. Telecky, Jr.

(57) ABSTRACT

A system (500) removes wafer edge residue from a target wafer (508). A wafer holding mechanism (502) holds and rotates the target wafer (508). A residue remover mechanism (504) mechanically interacts or abrades an edge surface of the target wafer (508) and removes strongly adhered residue from the edge surface of the target wafer (508). The residue remover mechanism (504) controls coverage of the mechanical interaction and magnitude of the mechanical interaction.

18 Claims, 5 Drawing Sheets

SYSTEMS AND METHODS FOR REMOVING WAFER EDGE RESIDUE AND DEBRIS USING A RESIDUE REMOVER MECHANISM

FIELD OF INVENTION

The present invention relates generally to semiconductor devices and more particularly to methods and systems for removing strongly adhered wafer edge residue

BACKGROUND OF THE INVENTION

Semiconductor devices are formed on semiconductor wafers by performing a number of fabrication processes. For example, layers are formed by depositing materials, layers are patterned by employing etch processes, trenches are formed in substrates and filled with material, surfaces of the devices are planarized and cleaned, and the like.

As a result of these fabrication processes, residues, including debris and contaminants, can be left on semiconductor wafers. For example, polishing/planarizing processes are typically employed to planarize layers deposited on the wafer. The polishing processes employ a chemical mechanical slurry and pad that mechanically and chemically planarize the wafer surfaces. After polishing, slurry residue is generally cleaned or scrubbed from wafer surfaces by mechanical scrubbing devices, such as polyvinyl acetate (PVA) brushes. These conventional cleaning processes tend to remove a substantial portion of the slurry residue, but some particles can remain as residue, particularly on edges of the wafer.

Another source of residue is due to metal film deposition. A clamp ring may be employed to secure a wafer to a heated pedestal within a deposition chamber to shield wafer edges from film disposition, such as to prevent metal from depositing along wafer edges and shorting subsequently formed devices as a result. Because the wafer and clamp ring possess different coefficients of thermal expansion, each expands at a different rate during metal film deposition. The shear force between the clamp ring and the wafer's edge may also generate edge particles that serve as a residue source.

Patterning processes employ photoresist masks that can leave ashed resist as contamination or residue afterwards. Additionally, deposited materials, including metals and nonmetals, can undesirably deposit on wafer edges as residue. Still other contaminants can be formed on the wafer edges from doping or ion implantation processes.

These residues can be sources of defects in later formed semiconductor structures. For example, layers can be formed on the residues or contaminants leading to blistering, delamination, undesired voids, and the like.

Some types of residue adhere to wafer edges more strongly than others and are, therefore, more troublesome to remove and prevent from contaminating subsequent processes. For example, wafer holding mechanisms, including pedestals, are often comprised at least partly of carbon material. The wafer holding mechanisms frequently grab wafers on their edges. As a result, the wafer holding mechanisms can leave carbon residue that is strongly adhered to the wafer edges. Such strongly adhered residue is not generally removable by conventional mechanisms.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor device fabrication by removing strongly adhered residue, including debris and contaminants, from edge/beveled surfaces of wafers with a residue remover mechanism. The strongly adhered residue, such as residue containing carbon and fluorine, is not typically removed by conventional clean processes. This residue can subsequently interfere with formation of other layers and degrade fabricated device performance. However, the present invention employs a residue remover mechanism that mechanically interacts with edge surfaces of wafers in order to remove strongly adhered residue. Additionally, the residue remover mechanism mitigates mechanical interaction with top surfaces of wafers where devices may be formed there on. As a result of its removal, the removed strongly adhered residue does not subsequently interfere with formation of other layers and/or degrade fabricated device performance.

In accordance with an aspect of the present invention, a system for removing strongly adhered residue is provided. The system comprises a wafer holding mechanism and a residue remover mechanism and operates on a target wafer. The wafer holding mechanism holds and rotates the target wafer. The residue remover mechanism mechanically interacts or abrades an edge surface of the target wafer and removes strongly adhered residue from the edge surface of the target wafer. The residue remover mechanism controls coverage of the mechanical interaction and magnitude of the mechanical interaction. Other systems and methods are disclosed.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

One or more implementations of the present invention will now be described with reference to the attached drawings, wherein like reference numerals are used to refer to like elements throughout, and wherein the illustrated structures are not necessarily drawn to scale.

The present invention facilitates semiconductor device fabrication by removing strongly adhered residue, including debris and contaminants, from edge/beveled surfaces of wafers with a residue remover mechanism. The strongly adhered residue, such as residue containing carbon and fluorine, is not typically removed by conventional clean processes. As a result, this residue can subsequently interfere with formation of other layers and degrade fabricated device performance. However, the present invention employs the residue remover mechanism that applies mechanical interaction to edge surfaces of wafers in order to remove strongly adhered residue. Additionally, the residue remover mechanism mitigates mechanical interaction with top surfaces of wafers where devices may be formed there on. As a result of its removal, the removed strongly adhered residue does not subsequently interfere with formation of other layers and/or degrade fabricated device performance.

Figure 1:
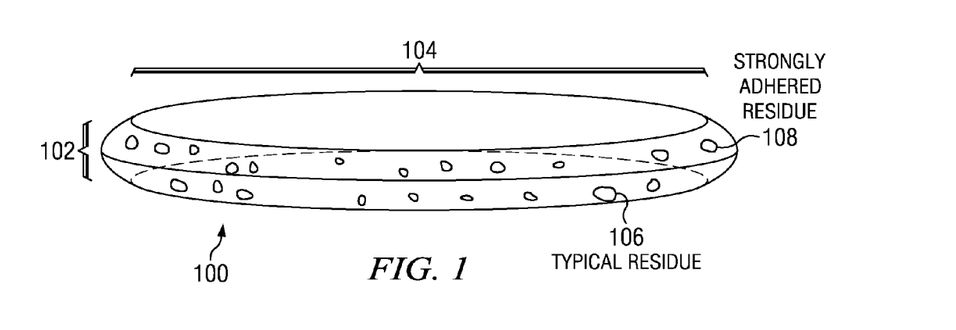
FIG. 1 is a perspective view of an exemplary semiconductor wafer with edge residue.

FIG. 1 is a perspective view of an exemplary semiconductor wafer 100 with edge residue. The wafer 100 is comprised of a semiconductor material, such as silicon. The wafer 100 has an edge surface 102, a top surface 104, and a bottom surface (not referenced with a reference numeral).

The top surface 104 is generally where semiconductor devices, such as transistors, capacitors, memory arrays, logic, and the like are formed. The top surface 104 can comprise a number of individual dies that have semiconductor devices formed therein. The wafer 100 has different layers and components formed therein according to the semiconductor devices being formed thereon and also according to a stage of fabrication. For example, at an initial stage of fabrication, the top surface 104 merely comprises silicon. At later stages of fabrication, isolation layers, gate structures, source drain regions, metallization layers, and the like can be formed thereon.

The edge surface 102 has a relatively curved or beveled surface and does not have devices formed thereon. The edge surface is often employed to hold or secure the wafer 100 during fabrication processes.

The fabrication processes employed to form semiconductor devices on the top surface 104 produce unwanted residue, including debris and contaminants that can remain on the top surface 104 and the edge surface 102 of the wafer 100. For example, chemical mechanical planarization is typically employed in device fabrication. This planarization employs a slurry that is typically cleaned from the top surface 104 by, for example, mechanical scrubbing devices. However, despite cleaning processes, some slurry can remain on the edge surface 102 and the top surface 104. Other sources of residue include metallization processes, which can leave metal materials as residue and debris. Additionally, patterning processes employ photoresist, which may not be completely removed and also becomes a source of residue. FIG. 1 shows typical residue 106 that can be present on the edge surface.

Some types of residue adhere to wafer edges more strongly than others and are, therefore, more troublesome to remove and prevent from contaminating subsequent processes. These types of residue are referred to as strongly adhered residue 108. For example, wafer holding mechanisms, including pedestals, are often comprised at least partly of carbon material. The wafer holding mechanisms frequently grab wafers on their edges. As a result, the wafer holding mechanisms can leave carbon residue that is strongly adhered to the wafer edges. Another example of strongly adhered residue is a fluorine based residue, which can be introduced by any fabrication process that employs fluorine. The strongly adhered residue 108 adheres to the wafer edge 102 more strongly than typical residue 106 at least partly because it contains carbon and/or fluorine. The strongly adhered residue 108, because of its strong adherence to the edge surface 102, is not generally removable by conventional mechanisms.

These residues 106 and 108 can be sources of defects in later formed semiconductor structures. The remaining residue, including debris and/or contaminants, can relocate from the edge surface 102 and onto the top surface 104. Subsequently performed fabrication processes and structures can be degraded due to the presence of the residues 106 and 108. For example, layers can be formed on the residues or contaminants leading to blistering, delamination, undesired voids, and the like. Further description of the defects that can be produced from the residues 106 and 108 are provided infra.

Figure 2:
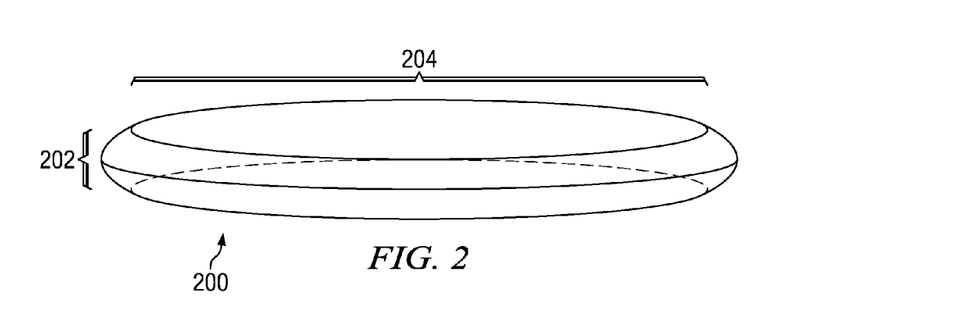
FIG. 2 is a perspective view of another exemplary semiconductor wafer wherein edge residue has been removed.

FIG. 2 is a perspective view of another exemplary semiconductor wafer 200 wherein edge residue has been removed. The wafer 200 is comprised of a semiconductor material, such as silicon. The wafer 200 has an edge surface 202, a top surface 204, and a bottom surface (not shown).

The top surface 204 is generally where semiconductor devices, such as transistors, capacitors, memory arrays, logic, and the like are formed. The top surface 204 can comprise a number of individual dies that have semiconductor devices formed therein. The wafer 200 has different layers and components formed therein according to the semiconductor devices being formed thereon and also according to a stage of fabrication. The edge surface 202 has a relatively curved surface and does not have devices formed thereon. The edge surface is often employed to hold or secure the wafer 200 during fabrication processes.

Residue, including conventional residue and strongly adhered residue were previously present, but were removed by systems and/or methods of the present invention.

Figure 3:
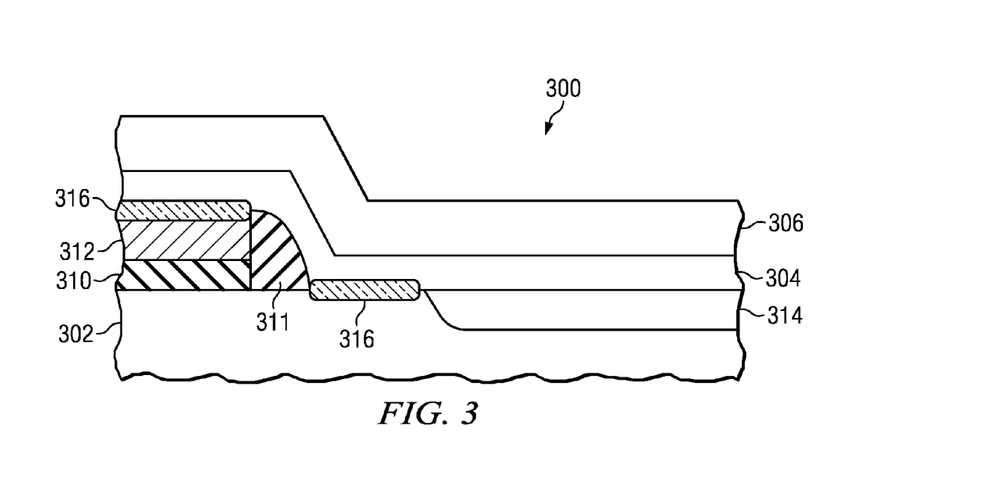
FIG. 3 is a cross sectional view of an exemplary semiconductor device that is partially formed.

FIG. 3 is a cross sectional view of an exemplary semiconductor device 300 that is partially formed. It is appreciated that the view is exemplary in nature and is not intended to depict all of the layers and/or structures present within such as device.

The device 300 comprises a silicon substrate 302 wherein isolation regions 314 are formed therein. The isolation regions 314 are depicted as shallow trench isolation regions, in this example. A gate structure comprised of a gate dielectric layer 310 formed on the silicon substrate and a gate electrode layer 312 formed on the gate dielectric layer 310 is shown. Sidewall spacers 311 are formed on laterally edges of the gate structure and are comprised of an insulative material, such as silicon nitride. Silicide regions 316 are formed on the gate structure and elsewhere in order to mitigate contact resistance and facilitate operation of the device 300. The silicide regions are comprised of a suitable metal material, such as $TiSi_2$, $CoSi_2$, or NiSi. A PMD liner 304 is formed over the gate structures and the silicon substrate 302 as shown in FIG. 3. A phosphosilicate glass (PSG) layer 306, which is a poly metal dielectric (PMD) layer, is formed on the PMD liner 304. The phosphosilicate glass 306, like many dielectric/insulative materials, is typically formed by a high density plasma process that includes simultaneous etching and deposition components.

Figure 4:
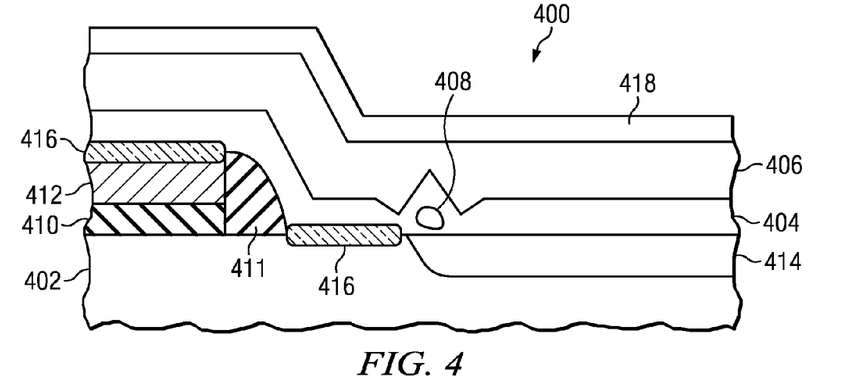
FIG. 4 is a cross sectional view of an exemplary semiconductor device that is partially formed and includes defect inducing residue.

FIG. 4 is a cross sectional view of an exemplary semiconductor device 400 that is partially formed and includes a residue inducing defect. It is appreciated that the view is exemplary in nature and is not intended to depict all of the layers and/or structures present within such as device.

The device 400 comprises a silicon substrate 402 wherein isolation regions 414 are formed therein. The isolation regions 414 are depicted as shallow trench isolation regions, in this example. A gate structure comprised of a gate dielectric layer 410 formed on the silicon substrate and a gate electrode layer 412 formed on the gate dielectric layer 410 is shown. Sidewall spacers 411 are formed on laterally edges of the gate structure and are comprised of an insulative material, such as silicon nitride. Silicide regions 416 are formed on the gate structure and elsewhere in order to mitigate contact resistance and facilitate operation of the device 400. The silicide regions are comprises of a suitable metal material, such as $TiSi_2$, $CoSi_2$, or NiSi. A PMD liner 404 is formed over the gate structures and the silicon substrate 402 as shown in FIG. 4. A phosphosilicate glass (PSG) layer 406, which is a poly metal dielectric (PMD) layer, is formed on the PMD liner 404. The phosphosilicate glass 406, like many dielectric/insulative materials, is typically formed by a high density plasma process that includes simultaneous etching and deposition components.

Prior to and/or during formation of the PMD liner 404, strongly adhered residue 408, such as carbon and fluorine based residue, relocates from an edge surface to the position indicated in FIG. 4. Deposition processes, such as high density plasma based deposition processes, can cause the residue 408 to relocate to the undesired location. The residue causes the phosphosilicate glass layer 406 to be formed defectively. A conductive layer 418, such as platinum, can formed on the phosphosilicate glass 406 in order to facilitate detection of defects. Because of the residue particle 408, the PSG layer 406, in this example, is formed improperly and a subsequent planarization process can open a hole or void where the residue 408 is located. As a result of the residue particle 408, the semiconductor device 400 is defective as formed and, in some cases, not properly operable. The residue 408 can cause undesired shorting, undesired open circuits, and the like.

Figure 5:
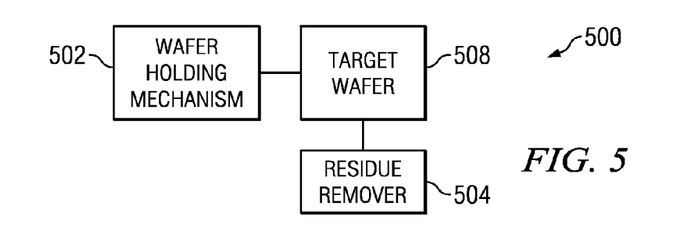
FIG. 5 is a block diagram illustrating a system for removing wafer edge residue in accordance with an aspect of the present invention.

FIG. 5 is a block diagram illustrating a system 500 for removing wafer edge residue in accordance with an aspect of the present invention. The system 500 employs a residue remover mechanism that physically removes strongly adhered residue (e.g., carbon and/or fluorine containing residue) and non-strongly adhered residue from wafer edge surfaces. The system 500 is described at a high level in order to facilitate understanding of the present invention.

The system 500 for removing wafer edge residue comprises a wafer holding mechanism 502 and a residue remover mechanism 504 and operates on a target wafer 508. The wafer holding mechanism 502 can be in a variety of forms, shapes, sizes, and compositions in order to safely and securely hold the target wafer 508 during residue removal. In one example, the wafer holding mechanism comprises a series of prongs that come in contact with the top or bottom surface of the wafer and hold the wafer 508 in place. The wafer holding mechanism 502 is comprised of a material, such as silicon carbide, that mitigates contamination of the target wafer 508.

It is noted that edge residue removal is typically performed after substantial semiconductor device fabrication has been performed on a top surface of the target wafer 508. These formed layers and structures can be easily damaged and/or contaminated resulting in a substantial loss. As a result, the wafer holding mechanism 502 is designed/configured so that damage to formed devices on the top surface of the target wafer 508 is mitigated. For example, fingers and or suction can be employed by the wafer holding mechanism 502 to hold the top and/or bottom surfaces of the target wafer 508. Additionally, the wafer holding mechanism 502 can be configured to hold the wafer 508 only on the bottom surface, thereby further mitigating damage and/or contamination by the holder 502 to the top surface of the wafer 508.

The target wafer 508 is comprised of a semiconductor material, such as silicon, and has the top surface, bottom surface, and edge surface, as described above. The edge surface has strongly adhered residue attached thereto. As stated previously, the strongly adhered residue generally comprises carbon and/or fluorine and is generally not removable with conventional wafer cleaning processes. Typical sources for the strongly adhered residue are wafer holders comprised of carbon based materials, such as polytetrafluoroethylene (PTFE).

The residue remover mechanism 504 employs a physical, mechanical interaction with wafer edge surfaces that physically removes strongly adhered residue therefrom. The residue remover mechanism 504 controls coverage and magnitude of the mechanical interaction. The residue remover mechanism 504 can remove only the strongly adhered reside and/or both the strongly adhered residue and underlying material, depending upon its implementation. The mechanical interaction is sufficiently intense to remove the strongly adhered residue from the wafer edge surfaces. This mechanical interaction is substantially stronger than employed by conventional devices that merely polish or remove non-strongly adhered residue.

Conventional devices employ little or no pressure, about less than 1 PSI, to remove loosely adhered particles or residue whereas the residue remover mechanism 504 typically employs greater amounts of pressure, such as about 3 PSI to 6 PSI or greater, in order to remove the strongly adhered residue. Mechanical interaction with the top surface of the target wafer 508 is mitigated in order to prevent or reduce damage to formed structures thereon. Some examples of suitable residue removers are provided infra.

The residue remover mechanism 504 may optionally employ a membrane, such as a polyethylene membrane, that employs a chemical and/or silica abrasive.

The residue remover mechanism 504 can also optionally employ a solution that facilitates residue removal during the mechanical interaction. The solution can, for example, dissolve the removed strongly adhered residue by being a relatively highly soluble solution or the solution can rinse away the strongly adhered residue. Additionally, the solution can comprise an etch chemistry, a dissolving/cleaning chemistry, and/or a combination thereof. The etch chemistry or cleaning chemistry comprises a solvent or acid that removes semiconductor material underlying the adhered residue thereby breaking the residue from the edge surface. The cleaning chemistry, highly soluble, dissolves the adhered residue thereby removing the residue from the edge surface. Suitable solutions employ an etching component, such as hydrofluoric acid, mixed in water and/or an organic solvent.

A number of parameters impact removal of strongly adhered residue from the edge surface of the target wafer 508 by the residue remover mechanism 504. These parameters can include, for example, material composition, applied mechanical pressure, rotational speed of the wafer 608, composition of the wafer 608, amount of strongly adhered residue present, and the like.

FIGS. 6A to 6D depict an edge grinding system 600 for removing strongly adhered residue in accordance with an aspect of the present invention. The edge grinding system 600 mechanically interacts with wafer edge surfaces in order to remove strongly adhered residue that has formed there on.

Figure 6A:
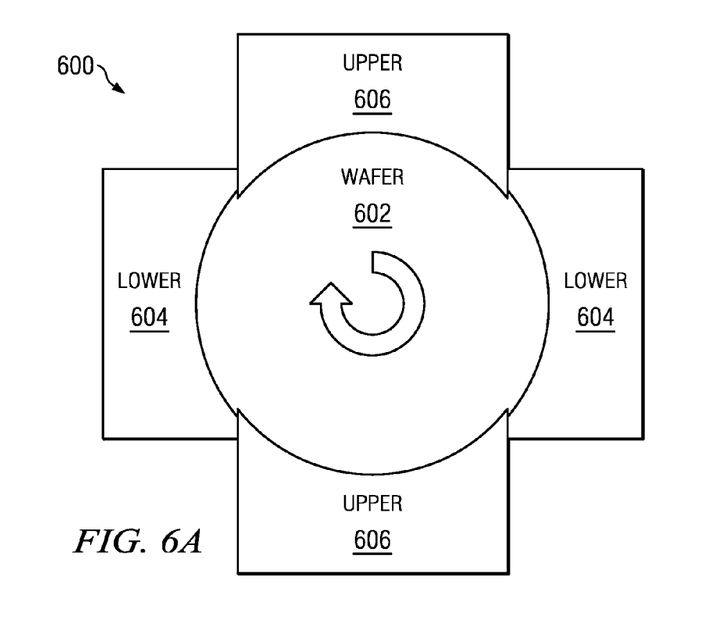
FIG. 6A is a top view of an edge grinding system for removing strongly adhered residue in accordance with an aspect of the present invention.

FIG. 6A is a top view of the edge grinding system 600 for removing strongly adhered residue in accordance with an aspect of the present invention. The system 600 operates on a target wafer 602 in order to remove strongly adhered residue from its edge surfaces.

The target wafer 602 is comprised of a semiconductor material, such as silicon and/or germanium, and has a top surface, bottom surface, and edge surface, as described previously. The edge surface may be beveled or non-planar and is at an outer edge of the wafer 602. Additionally, the edge surface typically has strongly adhered residue attached thereto as a result of previous fabrication processes. The strongly adhered residue generally comprises carbon and/or fluorine and is generally not removable with conventional wafer cleaning processes. Typical sources for the strongly adhered residue are wafer holders comprised of carbon based materials, such as PTFE.

The edge grinding system 600 comprises lower grinding components 604 and upper grinding components 606 in this aspect. The lower grinding components 604 and the upper grinding components 606 operate on an edge surface of a target wafer 602 to remove strongly adhered residue from an edge surface of the target wafer 602. The upper grinding components 606 are positioned at least partially above the target wafer 602 whereas the lower grinding components 604 are positioned at least partially below the target wafer 602. The components 604 and 606 are comprised of a suitable material that removes the strongly adhered residue and, optionally underlying material, when mechanically in contact with the edge surface of the target wafer 602.

The suitable materials that can be employed for the components 604 and 606 are typically relatively hard in order to sufficiently interact with the edge surface of the target wafer 602. Some examples of harder surfaces that can be employed for the upper and lower grinding components 604 and 606 include aluminum nitride, anodized aluminum, silicon carbon nitride, and the like. Examples of softer materials that can be employed for the upper and lower grinding components 604 and 606 include polyethylene and the like. Some suitable materials that can be employed with the upper and lower grinding components 604 and 606 in order to facilitate residue removal include, but are not limited to, silicon carbide, silicon carbon nitride (SiCN), cerium oxide (CeO), powdered silica and the like.

A number of parameters account for a grinding or etching rate of the system 600 including, but not limited to, material composition, applied grinding pressure, rotational speed of the wafer 602, composition of the wafer 602, amount of strongly adhered residue present, and the like.

Figure 6B:
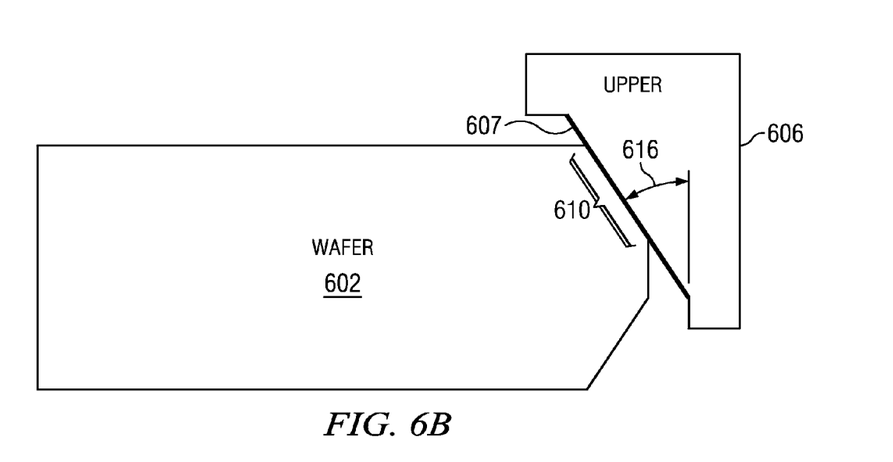
FIG. 6B is a cross sectional view of an edge grinding system for removing strongly adhered residue in accordance with an aspect of the present invention.

FIG. 6B is a cross sectional view of the edge grinding system 600 for removing strongly adhered residue in accordance with an aspect of the present invention. This view is presented to more fully illustrate the upper grinding components 606 and their interaction with the target wafer 602.

The upper grinding components 606 have a grinding edge 607 offset by an angle 616 from a vertical axis. The grinding edge 607 is comprised of a suitable material that can etch the edge surface of the wafer 602. The angle 616 is adjustable from 0 to 90 degrees so as to orient the grinding edge 607 to grind or etch an upper surface 610 of the edge surface as the wafer 602 rotates.

In this view, the grinding edge 607 is shown as being flat/planer with respect to the upper surface 610 of the wafer edge surface, which corresponds to the beveled shape of the wafer edge surface. However, it is appreciated that the grinding edge 607 can also be curved/non-planar with respect to the upper surface 610 for wafer edge surfaces that have curved outer edges.

Figure 6C:
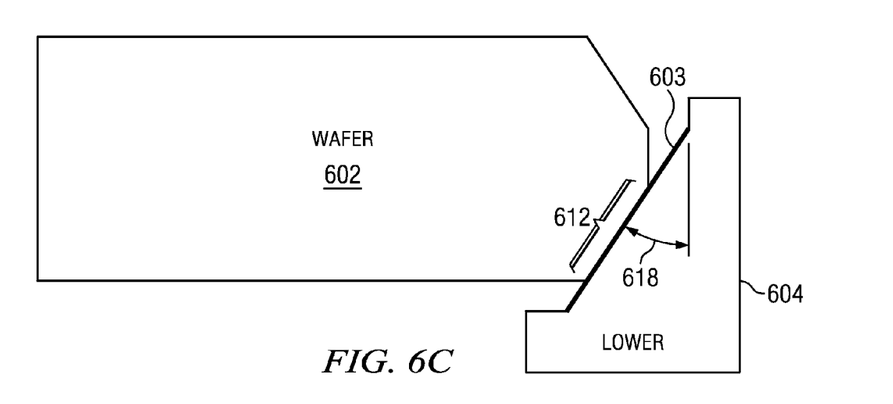
FIG. 6C is another cross sectional view of an edge grinding system for removing strongly adhered residue in accordance with an aspect of the present invention.

FIG. 6C is another cross sectional view of the edge grinding system 600 for removing strongly adhered residue in accordance with an aspect of the present invention. This view is presented to more fully illustrate the lower grinding components 604 and their interaction with the target wafer 602.

The lower grinding components 604 have a grinding edge 603 offset by an angle 618 from a vertical axis. The grinding edge 603 is also comprised of a suitable material that can etch the edge surface of the wafer 602. The angle 618 is adjustable from 0 to 90 degrees so as to orient the grinding edge 603 to grind or etch a lower surface 612 of the edge surface as the wafer 602 rotates.

In this view, the grinding edge 603 is again shown as being flat/planer with respect to the lower surface 612 of the wafer edge surface, which corresponds to the beveled shape of the wafer edge surface. However, it is appreciated that the grinding edge 603 can also be curved/non-planar with respect to the lower surface 612 for wafer edge surfaces that have curved outer edges.

Figure 6D:
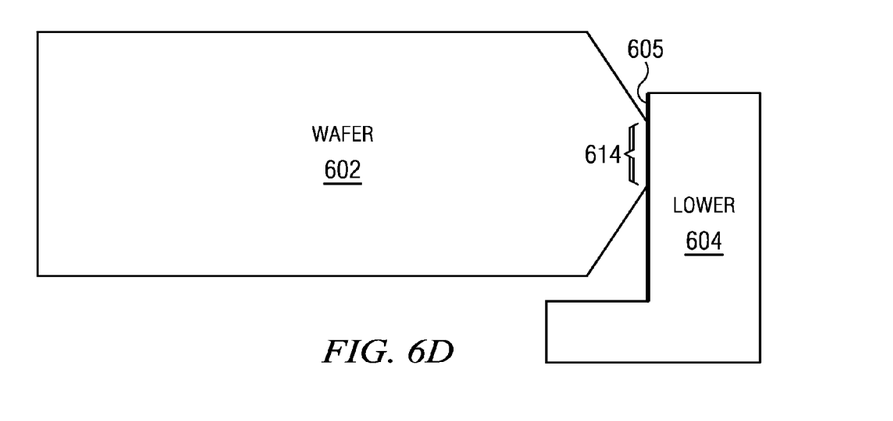
FIG. 6D is another cross sectional view of an edge grinding system for removing strongly adhered residue in accordance with an aspect of the present invention.

FIG. 6D is another cross sectional view of the edge grinding system 600 for removing strongly adhered residue in accordance with an aspect of the present invention. This view is also presented to more fully illustrate the lower grinding components 604 and their interaction with the target wafer 602.

As stated above with respect to FIG. 6C, the lower grinding components 604 have a grinding edge 603 offset by the angle 618 from a vertical axis. The angle 618 is set to about 0 degrees in this example so as to orient the grinding edge 603 to grind or etch a middle surface 614 of the edge surface as the wafer 602 rotates.

It is noted that lower grinding components 604 can have their associated grinding edges set to the same and or varied values. For example, one component may have its angle set to 0 degrees in order to remove strongly adhered residue from the middle surface 614 and the other may have an angle that permits grinding of the lower surface 612. The upper grinding components 606 can have their angles set similarly so as to grind the upper surface 610 and/or the middle surface 614, in this example.

It is also noted that variations of the system 600 are contemplated that omit one or more of the grinding components or include one or more additional grinding components.

Figure 7A:
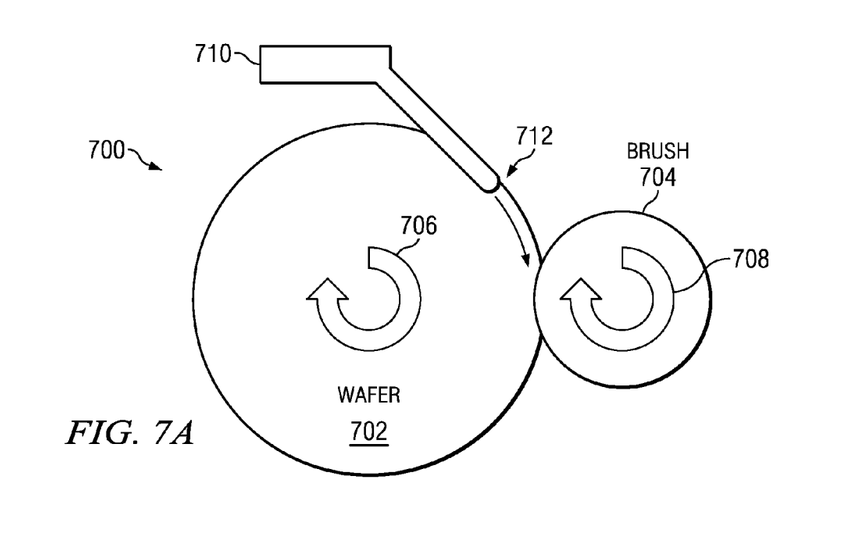
FIG. 7A is a top view of an edge scrubbing system for removing strongly adhered residue in accordance with an aspect of the present invention.
Figure 7B:
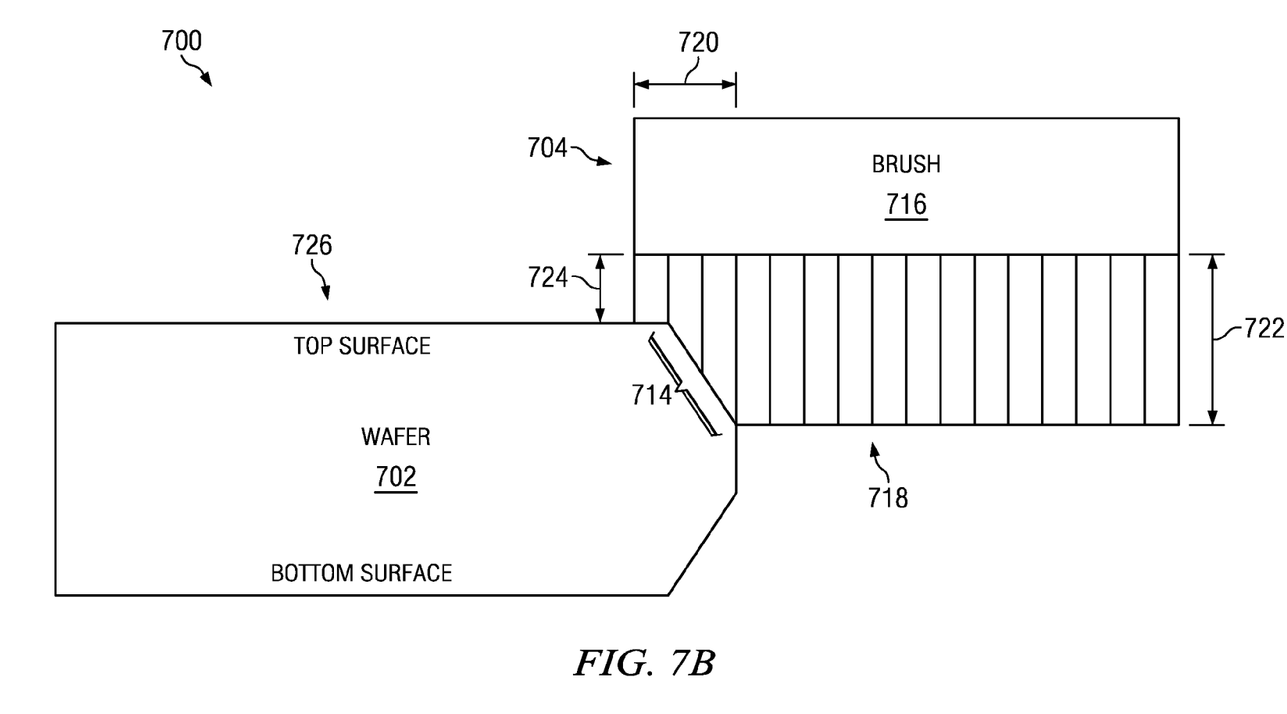
FIG. 7B is a cross sectional view of an edge scrubbing system for removing strongly adhered residue in accordance with an aspect of the present invention.

FIGS. 7A and 7B depict an edge scrubbing system 700 for removing strongly adhered residue in accordance with an aspect of the present invention. The edge scrubbing system 700 mechanically interacts with wafer edge surfaces in order to remove strongly adhered residue that has formed there on. The edge scrubbing system 700 removes strongly adhered residue without substantially removing underlying material or etching wafer edge surfaces.

FIG. 7A is a top view of the edge scrubbing system 700 for removing strongly adhered residue in accordance with an aspect of the present invention. The system 700 comprises a rotating brush 704 and a solution dispenser 710 and operates on a target wafer 702.

The target wafer 702 is comprised of a semiconductor material, such as silicon and/or germanium, and has a top surface, bottom surface, and edge surface, as described previously. The edge surface may be beveled or non-planar and is at an outer edge of the wafer 702. Additionally, the edge surface typically has strongly adhered residue attached thereto as a result of one or more prior fabrication processes. The strongly adhered residue generally comprises carbon and/or fluorine and is generally not removable with conventional wafer cleaning processes. Typical sources for the strongly adhered residue are wafer holders comprised of carbon based materials, such as poly-tetra-fluoro-ethylene.

The brush 704 is located on a plane parallel to a plane of the top surface of the target wafer 702. The brush 704 rotates in a direction and speed 708 and the wafer 702 rotates in a direction and speed 706 such that the brush 704 mechanically interacts with an edge surface of the target wafer 702. The brush 704 overlaps an outer portion of the wafer 702 and abrades the edge surface thereby removing the strongly adhered residue without impacting or damaging the top surface of the wafer 702 or re-depositing the removed material.

The solution dispenser 710 selectively dispenses a solution 712 that facilitates removal of the residue by the brush 704 by dissolving the strongly adhered residue before and/or after removal by the brush 704. The solution 712 is typically a non-etchant in that it does not substantially etch the edge surface or other surfaces of the target wafer 702. The solution 712 is at least slightly soluble with respect to the strongly adhered residue and it typically at least soluble or highly soluble with respect to the strongly adhered residue. The solution 712 may contain complexing agents such as inorganic types, coordination types (hexamminecobalt(III) chloride), chelates (ethylenediaminetetraacetic acid (EDTA), ethylenediaminedisuccinic acid (EDDS)), molecular complexes and the like.

FIG. 7B is a cross sectional view of the edge scrubbing system 700 for removing strongly adhered residue in accordance with an aspect of the present invention. The brush 704 is shown comprised of a head portion 716 and bristles 718 that are attached to the head portion 716.

The bristles 718 are comprised of a material that is sufficiently dense and/or rigid in order to apply sufficient pressure. Some examples of suitable materials include high density polyethylene, poly vinyl chloride, and the like. The bristles 718 have a diameter that provides sufficient rigidity, which is typically greater than conventional brushes employed in cleaning wafers.

During operation, the bristles 718 come into contact with at least a portion of the edge surface of the wafer. The contacted portion, shown here as an upper portion 714 of the edge surface, is due to a length 722 of the bristles 718, density of the bristles 718, rigidity of the bristles 718, an overage amount 720 from an outer edge of the wafer 702, and a gap 724 between the head portion 716 and a top surface 726 of the wafer 702.

The length 722 is selected to provide mechanical interaction with a desired portion of the edge surface of the wafer 702. Generally, the greater the length 722, the more coverage of the edge surface provided. In some aspects of the invention, the wafer 702 is flipped over to obtain suitable coverage for a bottom portion of the edge surface. The density and rigidity of the bristles 718 relates to the amount of abrasion applied to portions covered by the bristles 718. Typically, the greater the density and rigidity, the greater the abrasion applied by the bristles 718. The density and rigidity is selected such that strongly adhered residue can be removed by the bristles 718 during operation.

The overage amount 720 is the distance from an outer edge of the target wafer 702, as shown in FIG. 7B. The overage amount 720 is selected to adequately cover the wafer edge surface without substantially covering the top surface of the wafer 702. Doing so mitigates damage to components and/or structures formed on the top surface of the wafer 702. The gap 724 is a distance from the top surface of the wafer to a bottom surface of the brush head 716. The gap 724 is selected to cause the bristles 718 to apply an amount of pressure that removes the strongly adhered residue without damaging the top surface. It is appreciated that if the wafer 702 is oriented with its bottom surface facing the brush head 716, the gap 724 is redefined as the distance from the bottom surface to the brush head 716.

Figure 8:
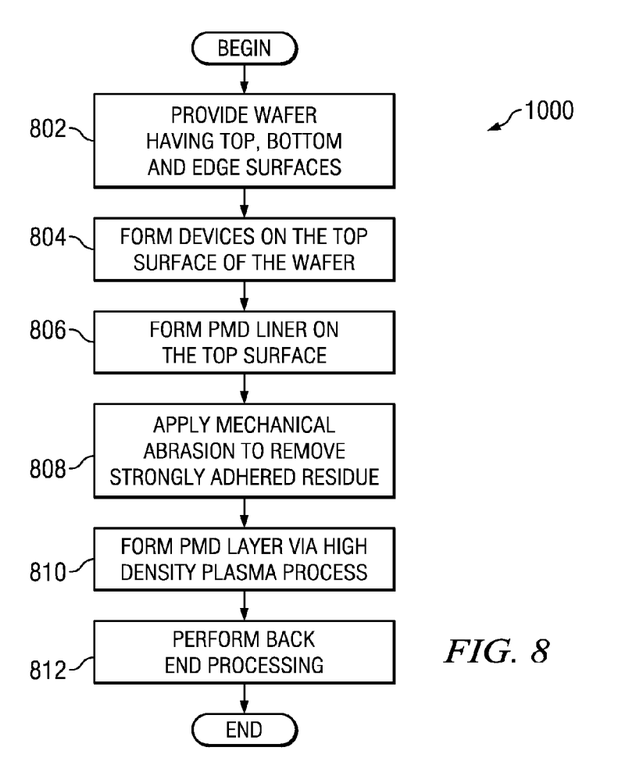
FIG. 8 is a flow diagram illustrating a method for removing residue from edge surfaces of a semiconductor wafer in accordance with an aspect of the present invention.

Referring now to FIG. 8, a flow diagram illustrating a method 800 for removing residue from edge surfaces of a semiconductor wafer in accordance with an aspect of the present invention is provided. The method 800 employs mechanical interaction or abrasion with wafer edge surfaces in order to remove strongly adhered residue.

While the method 800 is illustrated and described as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

The method 800 begins at block 802, wherein a wafer comprised of a semiconductor material and having a top surface, a bottom surface and an edge surface is provided. The top surface and the bottom surface are substantially planar and on opposite surfaces of the wafer. The edge surface, which is on an outer edge of the wafer, can be non planar, such as having a parabolic profile, or can be beveled.

Transistor devices are formed on the semiconductor wafer at block 804 by performing a series of fabrication processes that form source/drain regions, gate structures, isolation regions, and the like on the top surface of the wafer. The formed transistor devices can include n-type and/or p-type transistor devices. Additionally, silicide regions are typically formed on the source/drain regions and on the gate structures in order to reduce contact resistance and facilitate operation of the fabricated devices. Strongly adhered residue containing carbon can be formed on the edge surfaces as a byproduct of the fabrication processes performed at block 804.

A pre-metal dielectric liner is formed over the top surface of the wafer at block 806 by depositing and/or forming a suitable liner material such as nitride. The pre-metal dielectric liner mitigates undesired dopant diffusion to later formed layers and facilitates subsequent formation of a pre-metal dielectric layer. Again, strongly adhered residue containing carbon can be formed on the edge surfaces as a by-product of the liner formation performed at block 806.

Strongly adhered residue located on edge surface of the wafer is removed at block 808 by applying mechanical interaction or abrasion to the edge surface of the wafer. The mechanical interaction or abrasion can remove only the strongly adhered residue or the strongly adhered residue and an underlying layer of semiconductor material. The mechanical interaction or abrasion is applied by a residue remover mechanism as described supra. The residue remover mechanism, for example, can comprise grinding components, such as the system 600 shown in FIGS. 6A to 6D or a brush, such as the system 700 shown in FIGS. 7A and 7B, or variations thereof.

Subsequently, a high density plasma process is performed to form a pre-metal dielectric layer on the pre-metal dielectric liner at block 88. High density plasma processes contain etch and deposition components and can undesirably dislodge strongly adhered residue from edge surfaces of the wafer. This dislodged residue, if present, could form in a layer being formed by high density plasma processes as shown and discussed with respect to FIG. 4. However, the method 800 removes the strongly adhered residue at block 808 and, as a result, there is no strongly adhered residue remaining that can be displaced and become lodged in the pre-metal dielectric layer. Thereafter, back end processing is performed at block 812 including, but not limited to, contact and via formation, metal layer formation, and the like.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A system for removing wafer edge residue comprising:
   a wafer comprised of semiconductor material having a planar top surface, a bottom surface and an edge surface, wherein strongly adhered residue is initially formed on the edge surface and comprises one or more of carbon and fluorine based material;
   a holding mechanism that holds the wafer on the bottom surface, therein exposing the entirety of the edge surface; and
   a residue remover mechanism that mechanically interacts with the edge surface of the wafer to remove the strongly adhered residue from the edge surface.

2. The system of claim 1, wherein the residue remover mechanism comprises a grinding component that grinds away a surface portion of the edge surface to remove the strongly adhered residue.

3. The system of claim 1, wherein the holding mechanism comprises a plurality of prongs in contact with the bottom surface of the wafer.

4. The system of claim 1, wherein the holding mechanism rotates the wafer at a selected rotational speed.

5. The system of claim 1, wherein the residue remover mechanism comprises a solution dispenser and a soluble solution having a chemistry that is reactive with the strongly adhered residue, wherein the solution dispenser dispenses the soluble solution to dissolve the strongly adhered residue.

6. A residue remover system comprising:
   a wafer comprised of a semiconductor material having a top surface, a bottom surface, and an edge surface, wherein the top and bottom surfaces are substantially planar and the edge surface is non-planar;
   a holding mechanism that holds the wafer on the bottom surface, therein exposing the entirety of the edge surface, and wherein the holding mechanism rotates the wafer; and
   grinding components proximate to the edge surface and having a grinding edge that grinds a portion of the edge surface to remove strongly adhered residue comprising one or more of carbon and fluorine based material from the edge surface.

7. The system of claim 6, wherein the grinding components comprise upper grinding components positioned proximate an upper portion of the edge surface and having a grinding edge offset by a first angle from a vertical axis.

8. The system of claim 7, wherein the upper grinding components grind the upper portion of the edge surface.

9. The system of claim 8, wherein the grinding components further comprise lower grinding components positioned proximate to a lower portion of the edge surface and having a grinding edge offset by a second angle from the vertical axis.

10. The system of claim 9, wherein the first angle is equal to the second angle.

11. The system of claim 9, wherein the first angle is greater than the second angle.

12. The system of claim 6, wherein the grinding edge is substantially planar.

13. The system of claim 6, wherein the grinding edge is substantially non-planar.

14. A system for removing wafer edge residue comprising:
   a wafer comprised of semiconductor material having a planar top surface, a bottom surface and an edge surface, wherein strongly adhered residue is initially formed on the edge surface, and wherein the strongly adhered residue comprises one or more of carbon and fluorine based material;
   a holding mechanism that holds the wafer on the bottom surface, therein exposing the entirety of the edge surface;
   a soluble solution having a chemistry that is chemically reactive with one or more of the semiconductor material and the strongly adhered residue;
   a residue remover mechanism comprising a grinding component and a solution dispenser, wherein the grinding component mechanically interacts with the edge surface of the wafer to mechanically remove the strongly adhered residue from the edge surface, and wherein the solution dispenser dispenses the soluble solution to generally dissolve the strongly adhered residue.

15. The system of claim 14, wherein the soluble solution comprises a solvent or acid selected to remove the semiconductor material underlying the strongly adhered residue on the edge surface.

16. The system of claim 14, wherein the chemistry of the soluble solution dissolves the strongly adhered residue.

17. The system of claim 16, wherein the soluble solution comprises one or more of hydrofluoric acid and an organic solvent.

18. The system of claim 14, wherein the holding mechanism comprises a suction member configured to hold the bottom surface of the wafer.

* * * * *